United States Patent [19]

Morgan

[11] Patent Number: 5,574,738
[45] Date of Patent: Nov. 12, 1996

[54] MULTI-GIGAHERTZ FREQUENCY-MODULATED VERTICAL-CAVITY SURFACE EMITTING LASER

[75] Inventor: Robert A. Morgan, Bloomington, Minn.

[73] Assignee: Honeywell Inc., Minneapolis, Minn.

[21] Appl. No.: 476,965

[22] Filed: Jun. 7, 1995

[51] Int. Cl.$^6$ .................................. H01S 3/10; H01S 3/19
[52] U.S. Cl. ................................ 372/28; 372/46; 372/50; 372/96
[58] Field of Search ........................... 372/45, 46, 92, 372/28, 96

[56] References Cited

U.S. PATENT DOCUMENTS

| | | | |
|---|---|---|---|
| 4,885,592 | 12/1989 | Kofal et al. | 343/754 |
| 5,056,098 | 10/1991 | Anthony et al. | 372/45 |
| 5,115,442 | 5/1992 | Lee et al. | 372/45 |
| 5,206,872 | 4/1993 | Jewell et al. | 372/92 |
| 5,359,447 | 10/1994 | Hahn et al. | 359/154 |

OTHER PUBLICATIONS

R. Morgan et al., "Vertical–cavity surface–emitting laser arrays," (1995) SPIE, vol. 2398–09, Bellingham WA. (No Month).
D. Nugent et al., "Self–pulsations in vertical–cavity surface–emitting lasers," Jan. 5, 1995, *Electronics Letters.*
Y. Lee et al., "Top–Surface–Emitting GaAs Four–Quantum––Will Lasers Emitting at 0.85µm," May 24, 1990,, *Electronics Letters.*
J. Jewell et al., "Surface–emitting microlasers for photonic switching and interchip connections," Mar. 1990, *Optical Engineering,* vol. 29, No. 3.
D. Chemia et al., Chapter 4 "Nonlinear Optical Properties of Semiconductor Quantum Wells," 1988, *Optical Nonlinearities and Instabilities in Semiconductors,* pp. 83–120. (No Month).
S. Jiang et al., "High–frequency polarization self–modulation in vertical–cavity surface–emitting lasers," Dec. 27, 1993, *Applied Physics Letters,* pp. 3545–3547.
T. Banweil et al., "VCSE Laser Transmitters for Parallel Data Links," Feb. 1993, *IEEE Journal of Quantum Electronics,* vol. 29, No. 2, pp. 635–644.
F. Choa et al., "High–Speed Modulation of Vertical–Cavity Surface–Emitting Lasers," Aug. 1991, *IEEE Photonics Technology Letters,* vol. 3, No. 8, pp. 697–699.

*Primary Examiner*—James W. Davie
*Attorney, Agent, or Firm*—John G. Shudy, Jr.

[57] ABSTRACT

A GHz-range frequency-modulated laser based on manufacturable vertical cavity surface emitting lasers (VCSELs) and arrays. The present invention exploits a saturable absorber contained within the VCSELs distributed Bragg reflector which may itself be adjusted during fabrication or in operation. Under controllable operating conditions, the saturable absorber, strategically sized and placed, will force the VCSEL to self-pulsate (in the GHz-regime) at rates related to the local intensity, absorption, lifetime, and carrier density of the saturable absorber. These conditions can be controlled in real time in one of three ways; first, by adjusting the injection current into the VCSEL itself; second, for a fixed VCSEL bias and the use of a third terminal, by modifying the carrier density within the saturable absorber via additional current injection; or third, the saturable absorber can be reverse-biased by simultaneously altering its absorption and carrier lifetime and thus carrier density. Additionally, the frequency response can be controlled in the fabrication process by affecting the location of the saturable absorber, the mirror design and cavity Q, and the laser size (and hence threshold current). One can easily multiplex numerous GHz channels into a 100 plus GHz transmitter in a cost-effective manner. Application of the saturable absorber for self-pulsation provides for a decoherence of the VCSEL light output to eliminate modal noise in data communication systems, or for use as a local oscillator in an RF or other system. A plurality of VCSELs may be formed into an array having various frequencies, intensities, phases or other properties. The VCSELs may form a phased array, for instance.

12 Claims, 14 Drawing Sheets

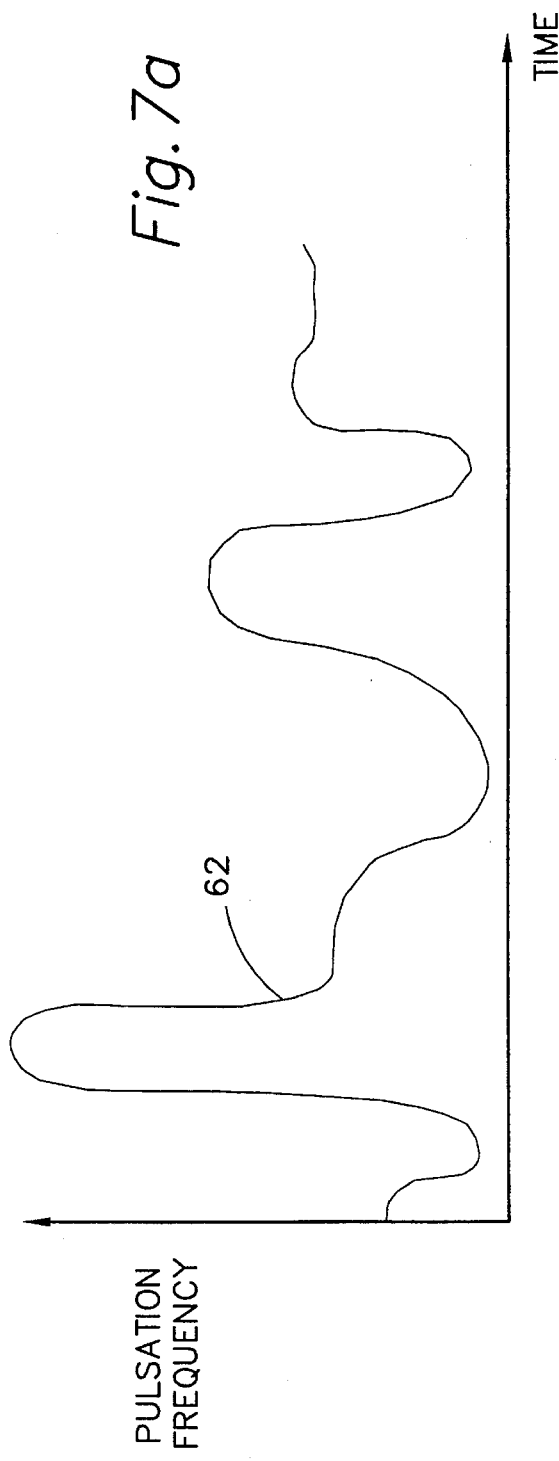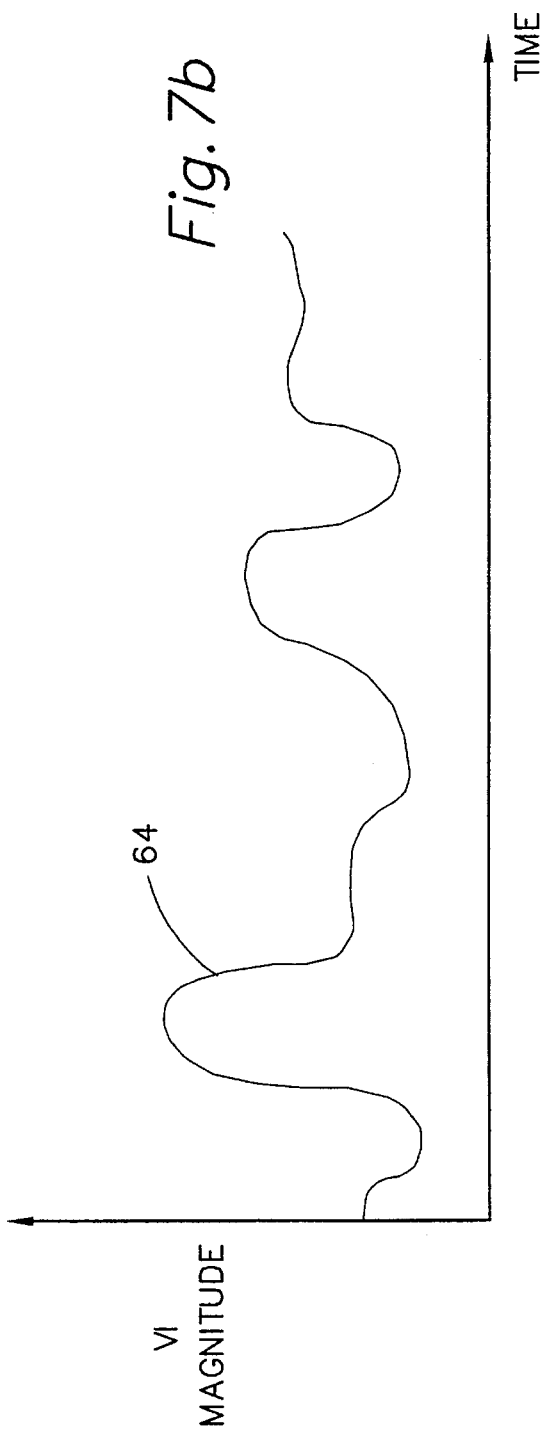

MULTI-GIGAHERTZ FREQUENCY-MODULATED VERTICAL-CAVITY SURFACE EMITTING LASER

BACKGROUND

This invention relates to the field of semiconductor lasers, and particularly relates to vertical cavity surface emitting lasers. More particularly, the invention relates to self-pulsing vertical cavity surface emitting lasers (VCSELs).

Conventional semiconductor lasers have found widespread use in modern technology as the light source of choice for various devices, e.g., communications systems, compact disc players, and so on. The typical semiconductor laser is a double heterostructure with a narrow bandgap, high refractive index layer surrounded on opposed major surfaces by wide bandgap, low refractive index layers. The low bandgap layer is termed the "active layer", and the bandgap and refractive index differences serve to confine both charge carriers and optical energy to the active layer or region. Opposite ends of the active layer have mirror facets which form the laser cavity. The cladding layers have opposite conductivity types and when current is passed through the structure, electrons and holes combine in the active layer to generate light.

Several types of surface emitting lasers have been developed. One such laser of special promise is termed a "vertical cavity surface emitting laser" (VCSEL). (See, for example, "Surface-emitting microlasers for photonic switching and interchip connections," *Optical Engineering*, 29, pp. 210–214, March 1990, for a description of this laser. For other examples, note U.S. Pat. No. 5,115,442, by Yong H. Lee et al., issued May 19, 1992, and entitled "Top-emitting surface emitting laser structures," which is hereby incorporated by reference, and U.S. patent application Ser. No. 08/175,016, by Mary K. Hibbs-Brenner, allowed, issue fee sent Mar. 20, 1995, and entitled "Integrated laser power monitor," which is hereby incorporated by reference, U.S. Pat. No. 5,475,701. Also, see "Top-surface-emitting GaAs four-quantum-well lasers emitting at 0.85 μm," *Electronics Letters*, 26, pp. 710–711, May 24, 1990.) The laser described has an active region with bulk or one or more quantum well layers. The quantum well layers are interleaved with barrier layers. On opposite sides of the active region are mirror stacks which are formed by interleaved semiconductor layers having properties, such that each layer is typically a quarter wavelength thick at the wavelength (in the medium) of interest thereby forming the mirrors for the laser cavity. There are opposite conductivity type regions on opposite sides of the active region, and the laser is turned on and off by varying the current through the active region. However, a technique for digitally turning the laser on and off, varying the intensity of the emitted radiation from a vertical cavity surface emitting laser by voltage, with fixed injected current, is desirable. Such control is available with a three terminal voltage-controlled VCSEL described in U.S. Pat. No. 5,056,098, by Philip J. Anthony et al., and issued Oct. 8, 1991, which is hereby incorporated by reference.

For several reasons, it is desirable to use surface emitting devices. For example, surface emitting devices can be fabricated in arrays with relative ease while edge emitting devices can not be as easily fabricated. An array of lasers can be fabricated by growing the desired layers on a substrate and then patterning the layers to form the array. Individual lasers may be separately connected with appropriate contacts. Such arrays are potentially useful in such diverse applications as, for example, image processing inter-chip communications, i.e., optical interconnects, and so forth. Second, typical edge-emitter lasers are turned on and off by varying the current flow through the device. This requires a relatively large change in the current through the device which is undesirable; the surface emitting laser, described below, requires lower drive current, and thus the change of current to switch the VCSEL need not be large.

High-yield, high performance VCSELs have been demonstrated, and expedited in commercialization. There have been demonstrated breakthroughs in record performance and flexibility exploiting variation of this VCSEL platform.

Top-surface-emitting AlGaAs-based VCSELs are producible in a manner analogous to semiconductor integrated circuits, and are amenable to low-cost high-volume manufacture and integration with existing electronics technology platforms. Moreover, VCSEL uniformity and reproducibility have been demonstrated using a standard, unmodified commercially available metal organic vapor phase epitaxy (MOVPE) chamber and molecular beam epitaxy (MBE) giving very high device yields.

The flexibility of this technology was exploited for lateral mode engineering including spatially filtered hybrid semiconductor/dielectric DBR VCSELs for single-mode emission with stable wavelengths and current. At the other extreme, a "quasi-incoherent" (multi-wavelength) VCSELs have been demonstrated with properties that alleviate modal noise in multi-mode fibers to overcome mode selective loss, especially in data communication applications, or analogously noisy speckle patterns in imaging applications.

SUMMARY OF THE INVENTION

The present invention is a controllable frequency-modulated, producible, vertical cavity surface emitting laser (VCSEL) and array. The invention uses a saturable absorber (SA) contained within the VCSEL's distributed Bragg reflector (DBR), or spacer (as described in "Self-pulsations in vertical-cavity surface-emitting lasers," by D. Nugent et al., *Electronics Letters*, 31, pp. 43–44, Jan. 5, 1995). Under appropriate operating conditions, the saturable absorber, strategically placed, forces the VCSEL to self-pulsate (in the GHz-regime) at rates related to the local intensity, absorption, lifetime, and carrier density at the saturable absorber. This characteristic is exploited as a technique to frequency modulate a VCSEL. These operating conditions can be controlled in real time by adjusting the injection current into the VCSEL itself, or by using a third terminal to modify the carrier density within the saturable absorber with additional current injection for a fixed VCSEL bias, or by reverse-biasing the saturable absorber thereby simultaneously altering the absorber's absorption and carrier lifetime and hence carrier density. Additionally, the center frequency of oscillation can be determined by the material, location and thickness of the saturable absorber, the mirror design, cavity Q and structure, and the laser size (and hence threshold current). Furthermore, by extending VCSELs of this type into arrays, one can easily multiplex numerous multi-GHz channels into a 100 plus GHz frequency-modulated transmitter in a cost-effective manner. Each of an array of individual VCSEL elements can have a particular modulation frequency range determined during fabrication and be further tuned during operation. The total operating range across the array can be increased by varying each element structure, and subsequently tuning it. VCSELs, arranged in an array, having differing sizes of apertures or other characteristics may be adjusted so as to form a phased array, with certain VCSELs turned on and others turned off, or a variation of frequency to achieve a certain direction of radiation by the resultant phased array, or a phased-antenna array controller. VCSELs permit the construction of highly effective, long range phased arrays functioning at high frequencies using low power with low cost, unsophisticated electronics, in contrast to radio frequency (RF) or millimeter (MM) based phased arrays.

An additional advantage may be determined by self-pulsation of the VCSEL which effectively decoheres the laser light output, wherein each individual pulse is reasonably coherent but the pulses together make the output laser light beam appear incoherent by averaging over the many pulses during the detection integration period, even though the laser beam itself may be in a coherent single transverse and longitudinal mode. Such decoherence can be used to reduce modal noise in a multi-moded fiber medium to overcome mode selective noise penalties. A two terminal version of the VCSEL is suited for decoherence purposes as a fixed VCSEL bias would be used for a predetermined frequency of self pulsation. A predetermined injected current would result in VCSEL emitting light pulsating at a certain frequency. The output of a VCSEL may be coupled into and conveyed by either a single mode or multi-mode medium or into a "free-space" lensed system. A controlled frequency modulated VCSEL may also serve as a low cost, low power optical local oscillator within numerous radio-frequency (RF) systems.

BRIEF DESCRIPTION OF THE DRAWING

FIGS. 7a and 7b show waveforms of VCSEL self-pulsation and modulation.

DESCRIPTION OF THE EMBODIMENTS

Figure 1:
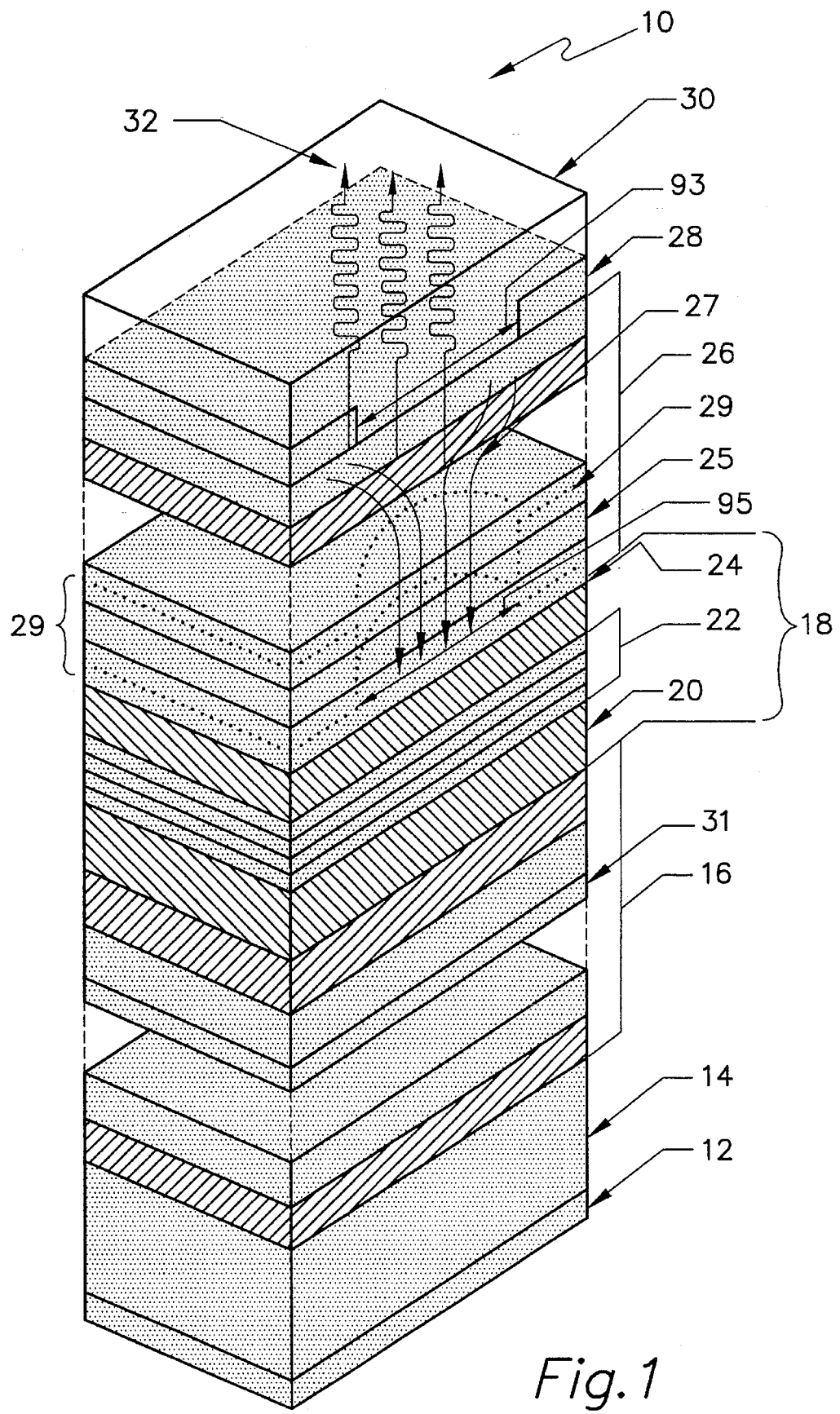
FIG. 1 is an illustration of a planar, current-guided, GaAs/AlGaAs top surface emitting vertical cavity laser.

In FIG. 1 is a diagram of a two terminal VCSEL 10. Formed on an n+ gallium arsenide (GaAs) substrate 14 is an n-contact 12. As indicated, substrate 14 is doped with impurities of a first type (i.e., n type). An n– mirror stack 16 is formed on substrate 14. Formed on stack 16 is a spacer 18. Spacer 18 has a bottom confinement layer 20 formed on stack 16, an active region 22 formed on layer 20 and a top confinement layer 24 formed on active region 22. A p– mirror stack 26 is formed on top confinement layer 24. A p– metal layer 28 is formed on stack 26. The emission region may have a passivation layer 30. Isolation region 29 restricts the area of the current flow 27 through the active region. Region 29 can be formed by deep H+ ion implantation or by other known techniques.

Spacer 18 may contain quantum wells disposed between mirror stacks 16 and 26. Stacks 16 and 26 are distributed Bragg reflector stacks. Quantum well active region 22 has alternating layers of aluminum gallium arsenide (AlGaAs) barrier layers and GaAs well layers. Stacks 16 and 26 have periodic layers of doped AlGaAs and aluminum arsenide (AlAs). The AlGaAs of stack 16 is doped with the same type of impurity as substrate 14 (i.e., n type), and the AlGaAs of stack 26 is doped with the other kind of impurity (i.e., p type).

Contact layers 12 and 28 are ohmic contacts that allow appropriate electrical biasing of laser diode 10. When laser diode is forward biased with a more positive voltage on contact 28 than on contact 12, active region 22 emits light 32 which passes through stack 26.

Figure 2:
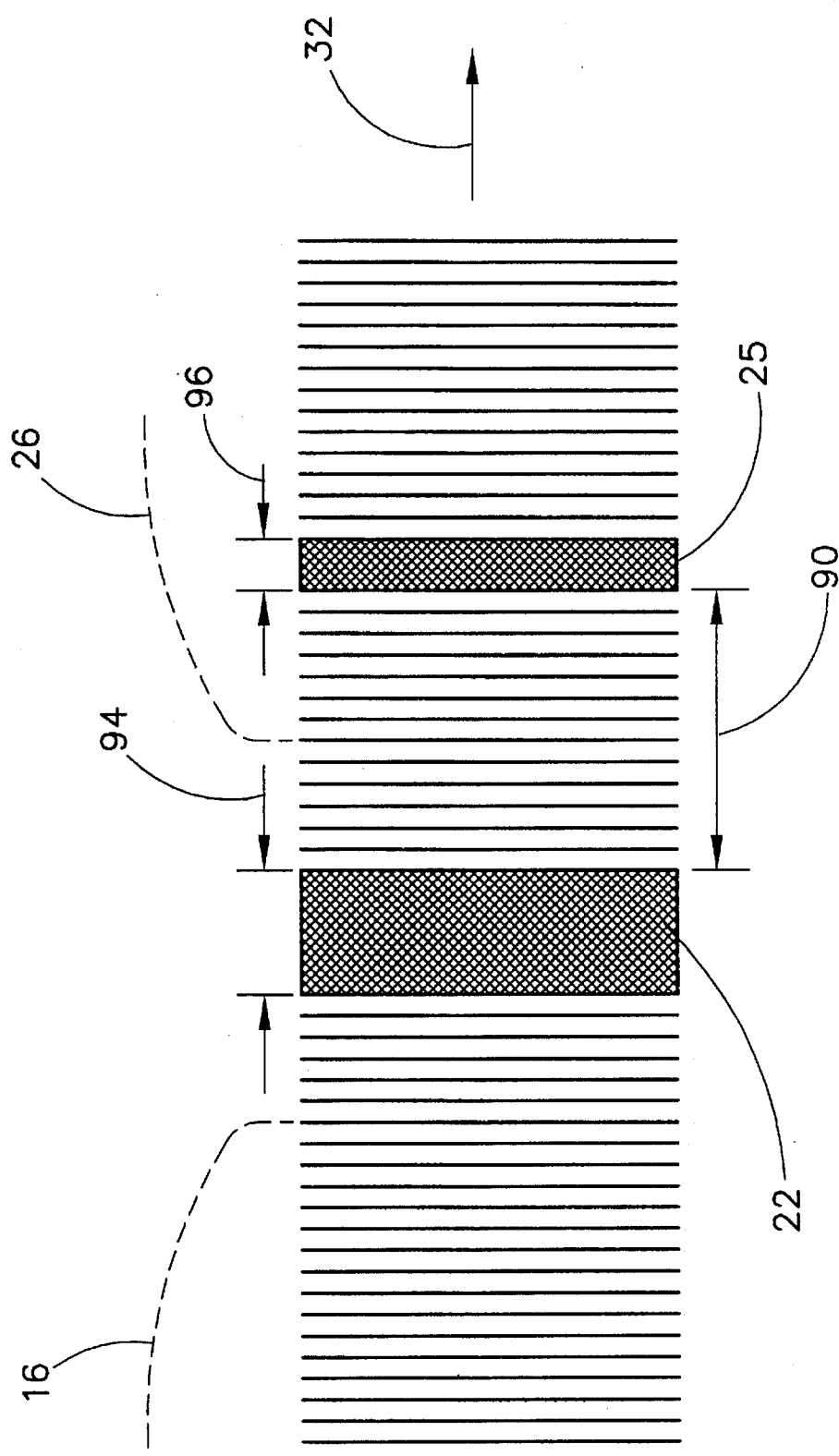
FIG. 2 is a schematic of a VCSEL with an absorber.
Figure 3:
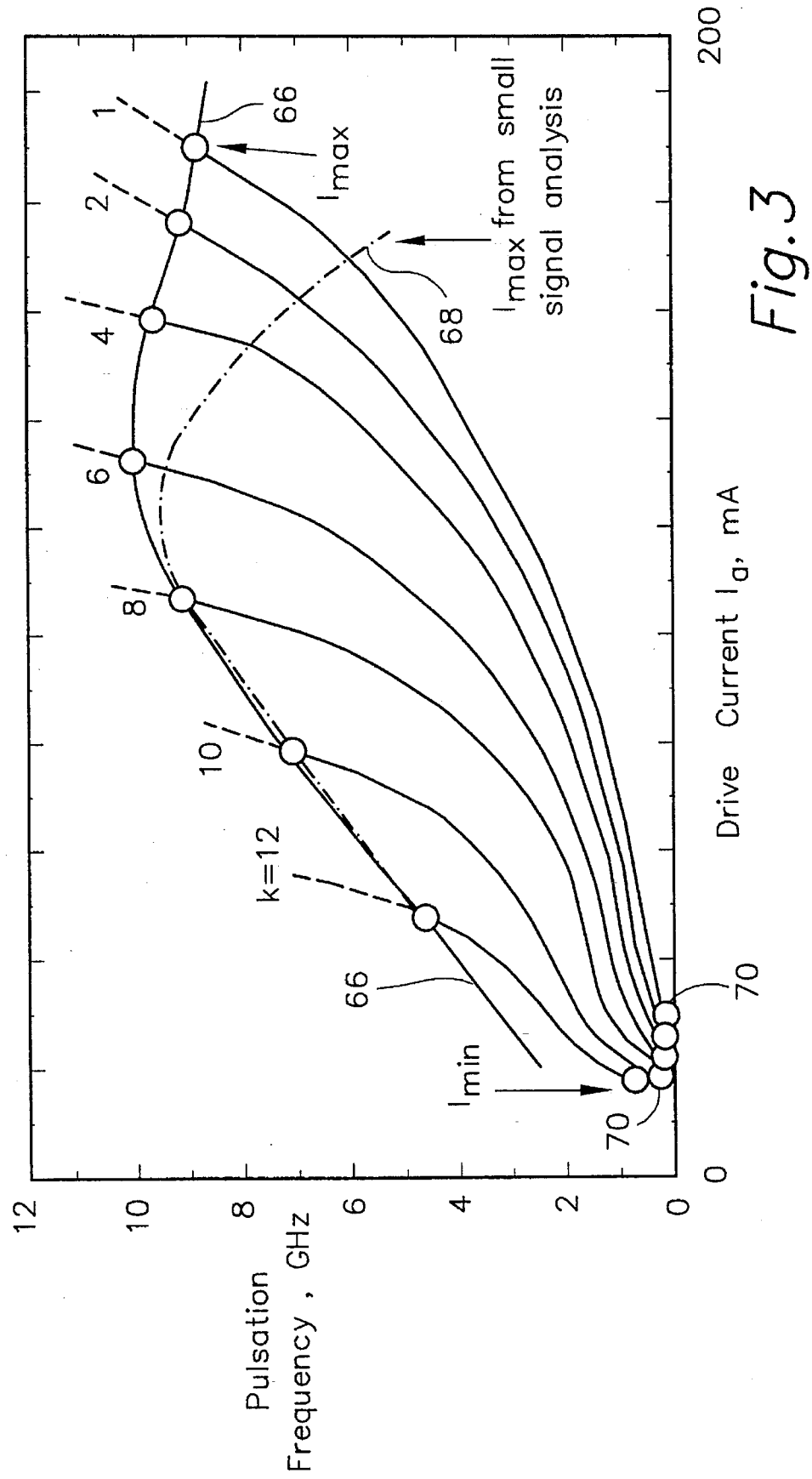
FIG. 3 is a graph of pulsation frequency versus drive current for various positions of a saturable absorber in a VCSEL.

There may be a saturable absorber, such as layer 25, composed of GaAs, for example, to absorb light at wavelengths ($\lambda$) less than 870 nm or composed of $In_xGa_{1-x}As$ quantum wells (such as 80 angstroms in thickness and wherein x may be 0.2 as an example) to absorb light at wavelengths less than one micron. Layer 25 can be of a $\lambda/4$ order in thickness but need not be such. Layer 25 can be situated anywhere in the stack of device 10. Instead, for instance, layer 31 may be the saturable absorber. Placement of the saturable absorber at a position in the cavity within layers 16 through 26 is influenced by the confinement factor. The saturable absorber may also be placed within spacer regions 20 or 24. For example, saturable absorber layer 25 is indicated to be a kth distance 90 of k one-quarter wavelengths from active region 22, as illustrated in FIG. 2 which is a schematic of a portion of VCSEL 10. Active region 22 is illustrated with a thickness 94 and absorber 25 with a thickness 96. The thickness should be chosen in conjunction with the rest of the structure to maintain an adequate optically thick cavity. FIG. 3 shows the results of pulsation frequency versus drive current for various (k) SA positions of $\lambda/4$ thickness for a VCSEL of a particular design but not necessarily VCSEL 10 of FIG. 1. Ibid., D. Nugent et al. The drive current for VCSEL 10 would be applied via contacts 28 and 12. These figures are noted again below. Note that pulsation frequency may be tuned by injection current and influenced by design (i.e., absorber position).

Figure 4:
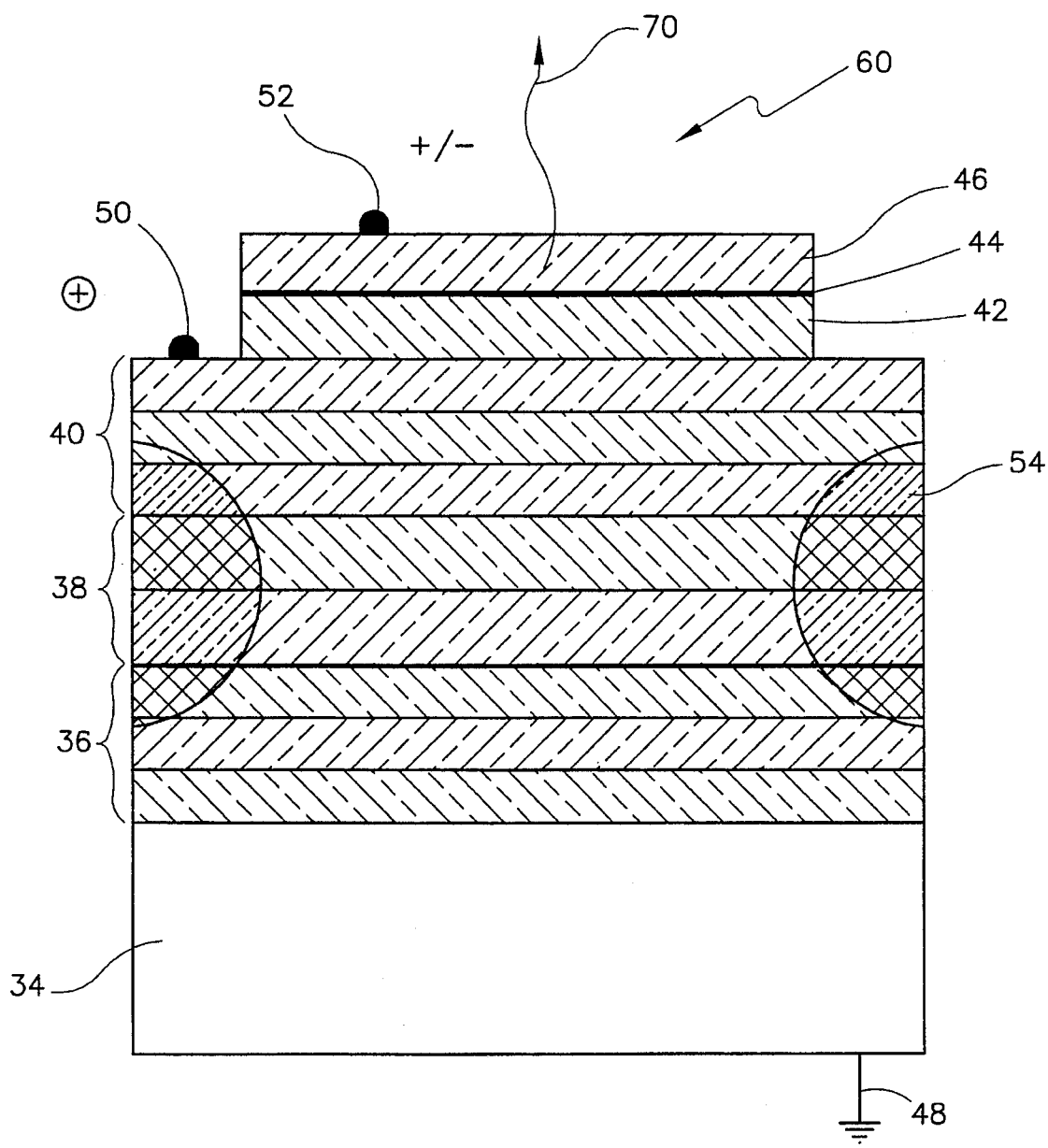
FIG. 4 is a cross-section of a three terminal frequency modulated VCSEL.

A three terminal version of a vertical cavity surface emitting laser is shown in a sectional view in FIG. 4, in contrast to the two terminal VCSEL of FIG. 1. The frequency of the self pulsations of VCSEL 60 light 70 may be modulated or tuned with a drive power of varying amplitude between terminals 52 and 50. The saturable absorber may be situated anywhere between terminals 50 and 52. This inexpensive, low power device 60 has a very large frequency modulation bandwidth. The application of current across terminals 48 and 50 of VCSEL 60 can be constant, but tuned to give the right center self-pulsation frequency and/or light output. This configuration would result in minimal amplitude modulation of the VCSEL 60 light 70, as opposed to a two-terminal current-injected frequency-modulated VCSEL.

Figure 5:
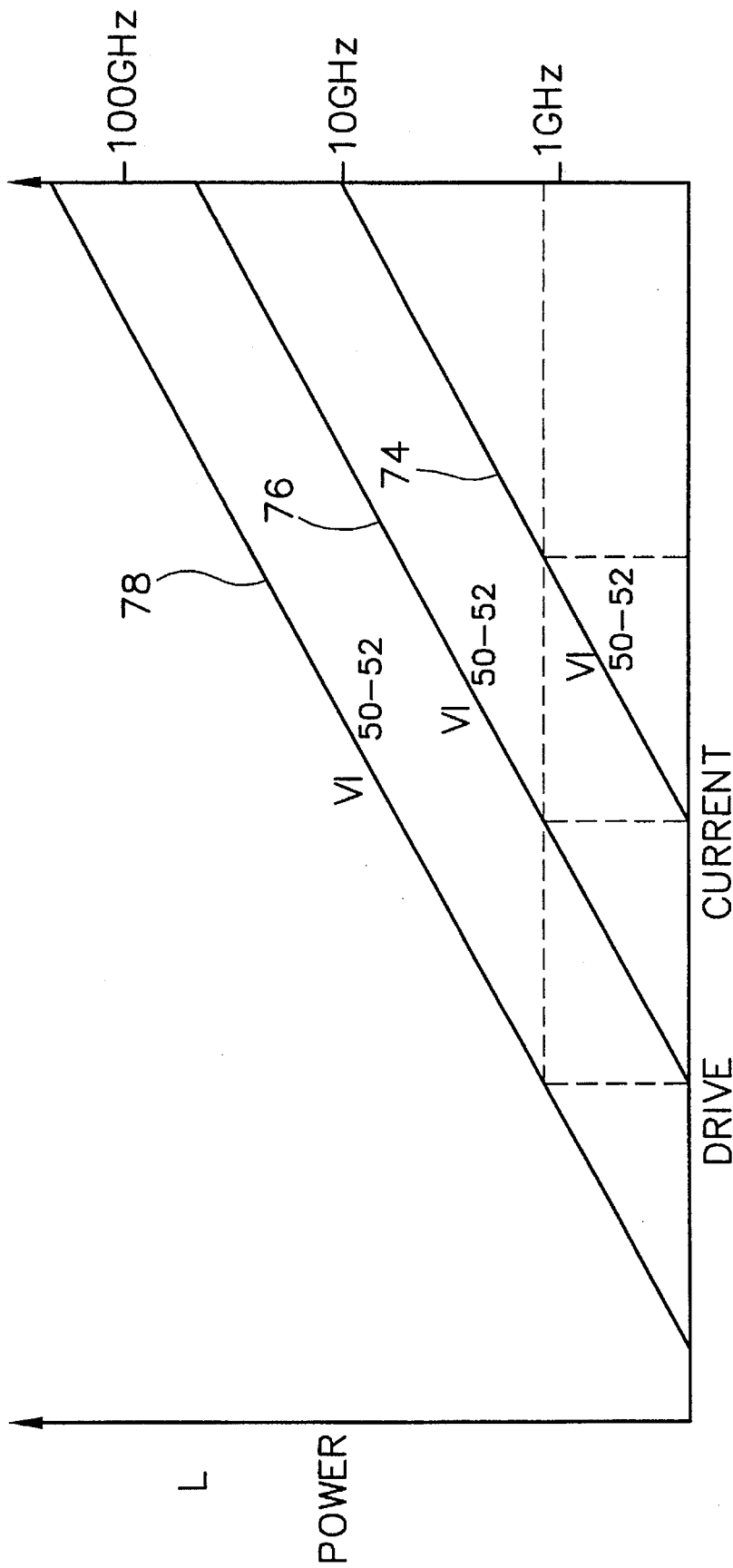
FIG. 5 are graphs for various voltage-current levels or light power and self-pulsation frequency versus drive current for a three terminal VCSEL.

Typically, the three terminal device 60 has a fixed constant current between terminals 48 and 50 resulting in a particular voltage-current (VI) (reverse or forward biased) being applied between those terminals. In FIG. 5, three levels 74, 76 and 78 of $VI_{50-52}$ (voltage-current) across terminals (50 and 52) are illustrated with light power and the self-pulsation frequency $f_{sp}$ versus the drive current through terminals 48 and 50. The drive power is used to modulate $f_{sp}$. VI 78 is greater than VI 76 which is greater than VI 74. As one can note, under these conditions for a given $f_{sp}$, the drive current is less for a greater VI, as indicated by the dashed lines.

As will be appreciated by those skilled in the art, some elements which are not essential to an understanding of the invention are either not depicted or described in detail. For example, only a single laser is illustrated in FIG. 4, although it will be readily noted that an array of lasers typically may be present. Shown are substrate 34, regions 36 and 46 having a first conductivity type, active region 38, regions 40 and 42 having a second conductivity type, with saturable absorption region 44 having either or neither conductivity type depending on design and operating conditions. Region 44 may comprise any number of bulk materials or one or more quantum wells, being normally absorbing at the lasing wavelength. Regions 36, 40, 42 and 46 comprise mirrors which are depicted as interference mirrors. Region 36 comprises a first mirror. Only several layers are shown for reasons of clarity. Appropriate regions of different conductivity types will be readily selected by those skilled in the art. Regions 40, 42, 44 and 46 form a second distributed mirror with a cavity Q and hence an oscillation frequency controllable via power applied to the saturable absorber through contacts 50 and 52. The active region typically comprises one or more quantum well regions which are interleaved with barrier layers, i.e., layers having a bandgap greater than the bandgap of the quantum well region. However, the use of bulk semiconductors instead is not precluded. There are first, second, and third electrical contacts 48, 50, and 52, to region 36, region 40, and layer 46, respectively. Contact 48 may be physically made to substrate 34 if the substrate is conducting and not semi-insulating. Isolation region 54 restricts the area of the current flow through the active region to the area generally under region 46. Isolation region 54 can be formed by, e.g., deep ion implantation. Other forms of current and optical confinement may be utilized. The portions of regions 36 and 40 having first and second conductivity types, form means for injecting carriers into the active region. The first and second interference mirrors further comprise a plurality of interleaved first and second semiconductor layers with each layer having characteristics such that it is typically a quarter wavelength thick at the medium wavelength of interest thereby forming the respective interference mirror. The individual layers of the active region and the interference mirrors are not described with particularity as those skilled in the art know the structure of these elements.

In the embodiment, substrate 34 is conducting or semi-insulating GaAs, and regions 36, 40, 42 and 46 comprise alternating layers of AlAs and AlGaAs, as an example, with properties as described in the previous paragraph. The active region may comprise one or multiple GaAs (or, e.g., $In_xGa_{1-x}As$) quantum wells interleaved with AlGaAs barrier layers. Saturable absorption (SA) region 44 is optically coupled to region 40, i.e., the absorption due to the SA is within the distributed mirror incorporating regions 40, 42, 44 and 46. Region 46 comprises interference mirror layers of, e.g., AlAs and AlGaAs, and has a first conductivity type. Those skilled in the art will readily select appropriate layer thicknesses and these parameters need not be described in detail. The use of other semiconductors is contemplated and appropriate choices will readily be made by those skilled in the art. For instance, other Group III–IV semiconductors may be used.

Conventional and well-known epitaxial growth techniques, such as molecular beam epitaxy or metallo-organic chemical vapor deposition, may be used to grow the layers described. After the layers have been grown, conventional patterning techniques are then used to form the individual lasers in the array. Electrical contacts to the individual lasers are also fabricated. Those skilled in the art will readily select appropriate patterning and contacting techniques.

Figure 6:
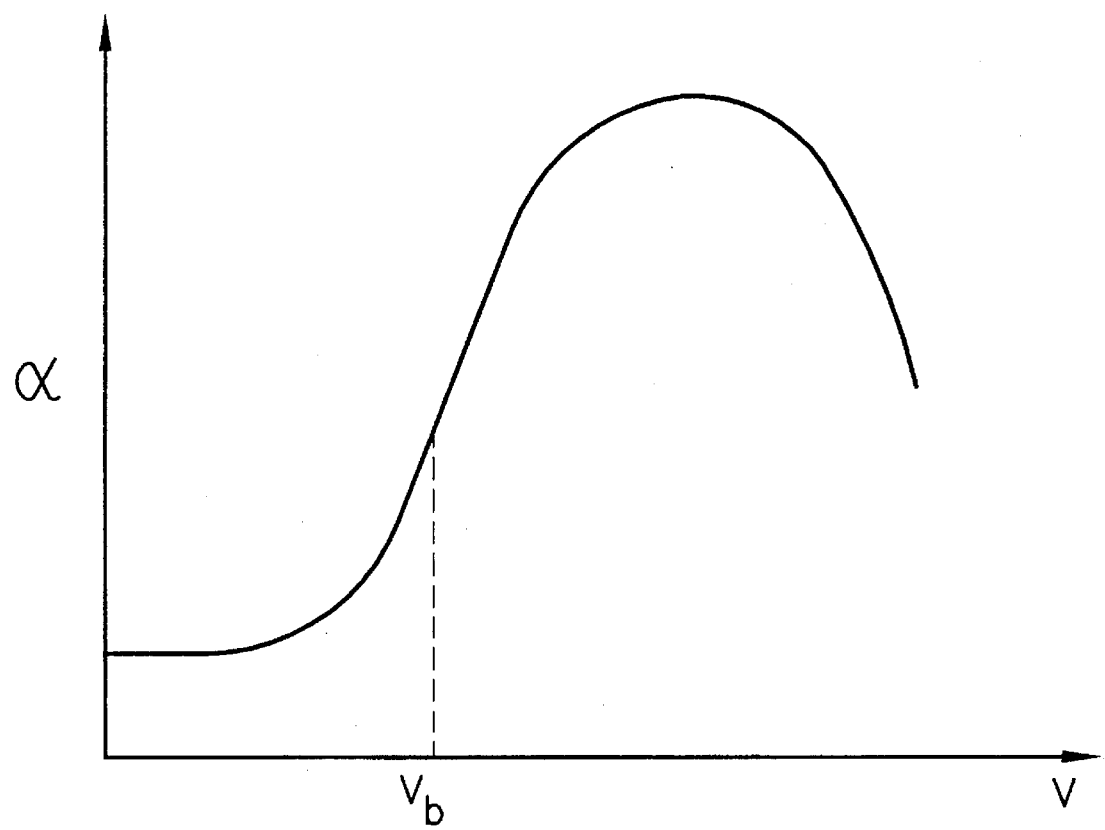
FIG. 6 is a plot of the absorption coefficient of a quantum well region versus the applied (reverse) voltage.

The frequency of oscillation of the self-pulsing light emitted from the device can be varied by controlling the properties of the SA region within the VCSEL structure. An embodiment may use current or voltage alteration of bulk or quantum-well material such as the quantum-confined Stark effect in quantum wells. This effect is well known and understood by those skilled in the art; the effect is described in Chapter 4 entitled "Nonlinear optical properties of semiconductor quantum wells," by D. S. Chemla et al., in *Optical Nonlinearities and Instabilities in Semiconductors*, pp. 339–347, (Academic Press 1988). Basically, the exciton absorption depends on the magnitude of the electric field in the quantum well. FIG. 6 plots the absorption coefficient $\alpha$ of the quantum well region vertically versus the applied voltage V horizontally for a wavelength longer than that of the zero field exciton. In other words, in this figure, the absorption coefficient $\alpha$ is plotted vertically versus the voltage V horizontally for an exemplary quantum-confined Stark effect region useful in the present device. For device 60, a voltage is between contacts 52 and 50, i.e., a reverse bias p-i-n junction, and an increasing voltage corresponds to an increasing electric field and vice versa, Arbitrary units are used for purposes of exposition, The initial voltage is $V_b$. The absorption coefficient $\alpha$ can be varied a significant amount with a relatively small change in the applied voltage. Similarly the field-dependent Franz-Keldysh effect can be used for an SA composed of bulk material, The use of this characteristic is noted below, Moreover, SA 44 of FIG. 4 may be forward biased to inject current into it also allowing frequency tuning.

A vertical cavity surface emitting laser needs relatively large reflectivities in both mirror stacks for lasing; typically, mirror stack reflectivities should be 99 percent or greater. The SA region functions as a bias-dependent absorber, by appropriately varying the bias, the laser pulsation can be frequency modulated at different rates. A small voltage or current change may be used to vary the absorption or carrier density of the SA and hence the frequency of the VCSEL self-pulsation. However, the magnitude of the current supplied through contacts 48 and 50 of device 60 of FIG. 4, may remain essentially constant as the laser is modulated. This simplifies the design of the power supply (not shown) for the array and minimizes any problems that might otherwise arise due to the varying heat generated in the vertical cavity laser array, due to the varying carrier density in the active region, and due to the resulting index changes in the optical cavity.

The optical spatial field distribution of the surface emitting laser and the position of the saturable absorber are both engineering parameters. More or less absorption can be obtained by placing the absorber near a node or antinode, respectively. More or less absorption can also be obtained by increasing or decreasing the reflectivity of regions 40 and 36 of device 60, thereby coupling relatively less or more of the SA into the distributed mirror. Additionally, the material, thickness and/or design and number of the quantum wells, or of bulk materials, in SA 44 can be varied from that described herein. Those skilled in the art will readily select appropriate parameters.

The invention utilizes the saturable absorber in the optical cavity to achieve high-speed bias-controlled tuning of the self oscillation or pulsation frequency of a VCSEL or VCSEL array while maintaining constant current and hence minimizing chirp, relaxation oscillations, and so forth. In FIG. 4, terminal 50 represents the top (usually the p type) contact and terminal 48 represents the bottom contact (usually the n type) contact. The bottom contact may be a common metalization on the bottom like contact 12 as shown in FIG. 1. Contact 52 represents a third connection which can be used to either reverse bias or forward bias the saturable absorber layer which is schematically illustrated by layer 44.

The incorporation of a saturable absorber can result in self pulsations of the laser and is a common technique for "mode-locking" the laser to produce a train of laser pulses whose period is proportional to the cavity length. FIG. 7a reveals the nature of a frequency-modulated self-pulsing waveform. Profile 62 is the frequency of the self-pulsations of the VCSEL with respect to time. Profile 64 is the amplitude of the modulating waveform of the power (VI) signal sent to the VCSEL. The overall envelope 62 may of course be changed by the power (VI) between terminals 48 and 50 of VCSEL 60. The waveform of the self-pulsations switches between $I_{max}$ and $I_{min}$ which are light "on" and light "off" conditions, respectively, of the pulsation. $I_{min}$ may be between zero amplitude and $I_{max}$, depending on the electrical and physical characteristics of, and the power parameters to the VCSEL, and is ideally zero.

Self pulsations up to 6 GHz have also been demonstrated in a VCSEL external cavity configuration, utilizing the VCSELs geometrical polarization degeneracy. This approach is also a way of producing GHz-range self-modulation whose frequency can be modulated by varying the optical cavity length. "High Frequency Polarization Self-modulation in Vertical Cavity Surface Emitting Lasers," by S. Jiang et al., on pp. 3545–3547 in *Appl. Phys. Lett.*, Vol. 63 (1993). Self pulsations within a long-wavelength VCSEL were theoretically analyzed using the following coupled rate equations (Ibid., Nugent et al.):

$$dP/dt = \Gamma_a g_a (n_a - n_{0a}) P + \Gamma_s g_s (n_s - n_{0s}) P - P/\tau_{pb} + V_a \beta B n_a^2 \quad (1);$$

$$dn_a/dt = -\Gamma_a g_a (n_a - n_{0a}) P/V_a - n_a/\tau_a + I_a/eV_a \text{ TM} \quad (2); \text{ and}$$

$$dn_s/dt = -\Gamma_s g_s (n_s - n_{0s}) P/V_s - n_s/\tau_s + (I_s/eV_s) \quad (3);$$

where we have added the third term in equation (3) to allow for additional modulation of the SA.

In the equations, the subscripts "a" and "s" identify the active and saturable absorber, respectively; the symbol "Γ" refers to the photon confinement factor. The third term $I_s/eV_s$ is added in equation (3) to represent the case for current injection via contacts 50 and 52 as shown in FIG. 4. In the third equation, $\Gamma_s$ and $V_s$ are determined or affected by material, structure and material placement; and $g_s$, $n_s$, $n_{0s}$, $\tau_s$ and $I_s$ are changed by current-voltage ($VI_{50-52}$) across terminals 50 and 52, and the device consequently can be tuned.

In the three above-disclosed equations, the respective terms mean: $\Gamma_a$ is the active region confinement factor; $g_a$ is the active region differential gain; $n_a$ is the active region carrier density; $n_{0a}$ is the active region transparency density; P is the optical power; $\Gamma_s$ is the SA confinement factor; $g_s$ is the SA differential gain; $n_s$ is the SA carrier density; $n_{0s}$ is the SA transparency density; $\tau_{pb}$ is the cavity lifetime; $V_a$ is the active region volume; β is the spontaneous emission factor; B is the bimolecular recombination coefficient; $\tau_a$ is the active region lifetime; $I_a$ is the active region injection current; e is the electron charge; $V_s$ is the SA volume; $\tau_s$ is the SA lifetime; and $I_s$ is the current in the SA.

FIG. 3 graphically represents the calculations of pulsation frequency versus drive current for long-wavelength laser parameters. Ibid. Nugent et al. The k-parameter represents the location of the saturable absorber, assumed to be the kth quarter wave in active spacer 18 of FIG. 1. The graph of FIG. 3 shows the self-sustained pulsation frequency in GHz of a VCSEL, versus drive current $I_a$ in milliamperes for various k's of the saturable absorber. Curve 66 shows the maximum drive currents and corresponding frequencies for the respective k's for self-sustained pulsations. Curve 68 shows the maximum drive currents against frequencies of damped relaxation oscillations, determined from small signal analyses. Points 70 reveal the minimum drive currents for the various k's. Ibid., D. Nugent et al. The absolute current, frequency and k dependence will vary in accordance with equations (1)–(3) for VCSEL 60.

Figure 8A:
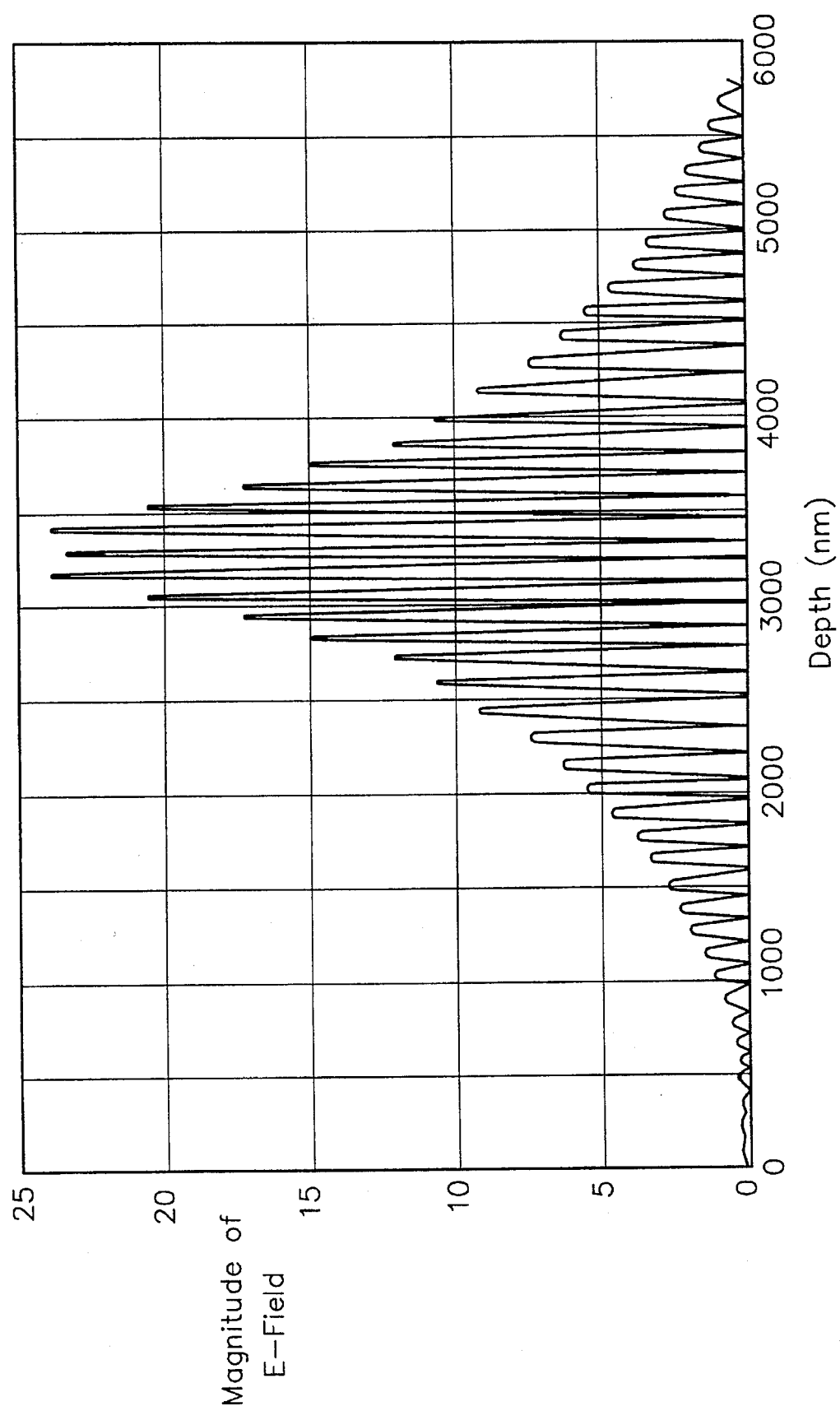
FIG. 8a is an optical field distribution of a VCSEL.
Figure 8B:
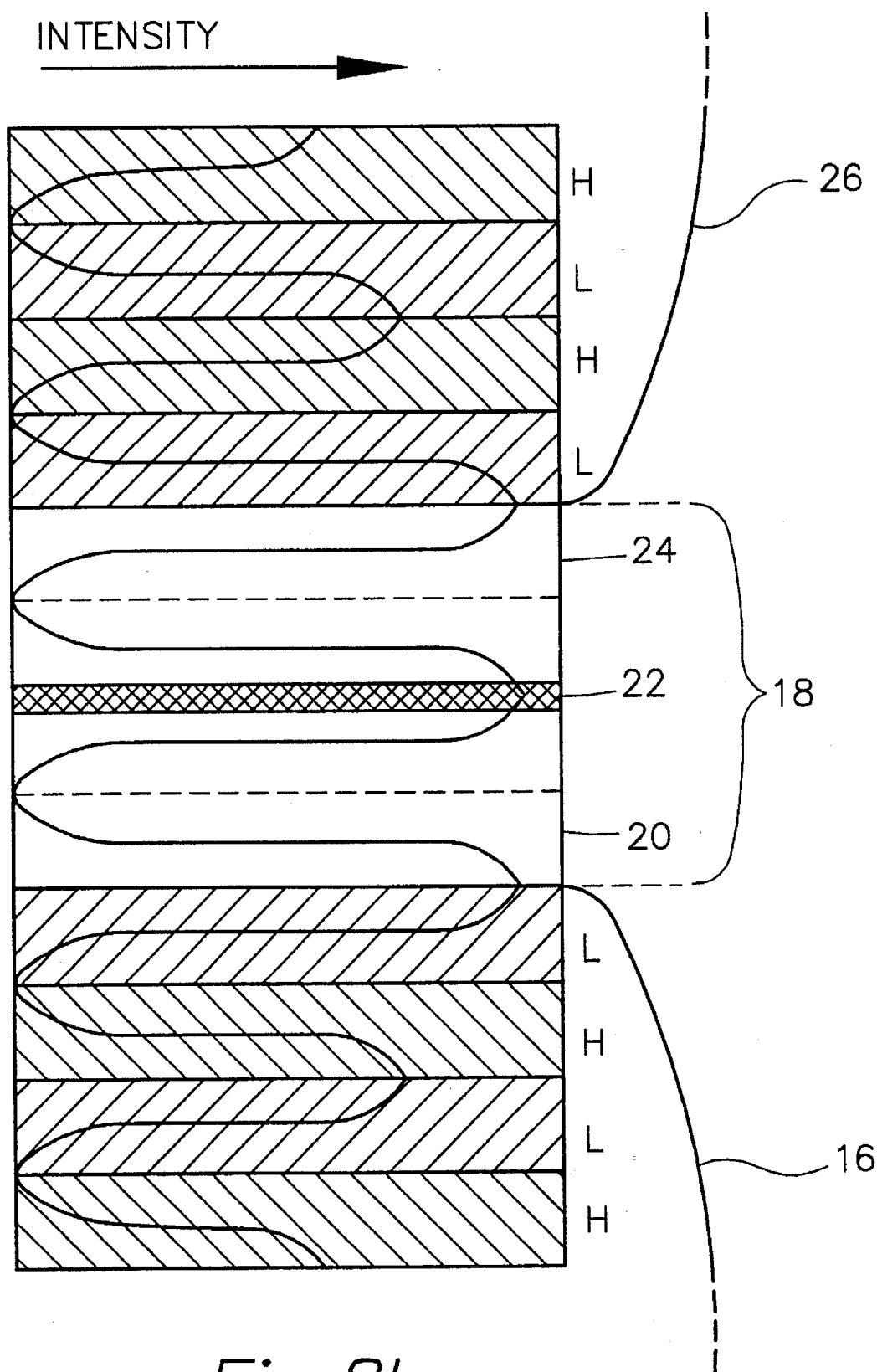
FIG. 8b shows light intensity versus position near the active region of a VCSEL.

The optical intensity of the light decreases roughly exponentially from the spacer region as indicated in FIG. 8a. This figure reveals the photon density distribution within the VCSEL structure. FIG. 8b shows a relationship of light intensity relative to physical position in the VCSEL for a typical VCSEL with a one λ-thick cavity (a cavity having one of other multiples of λ/2 is also possible).

Figure 9:
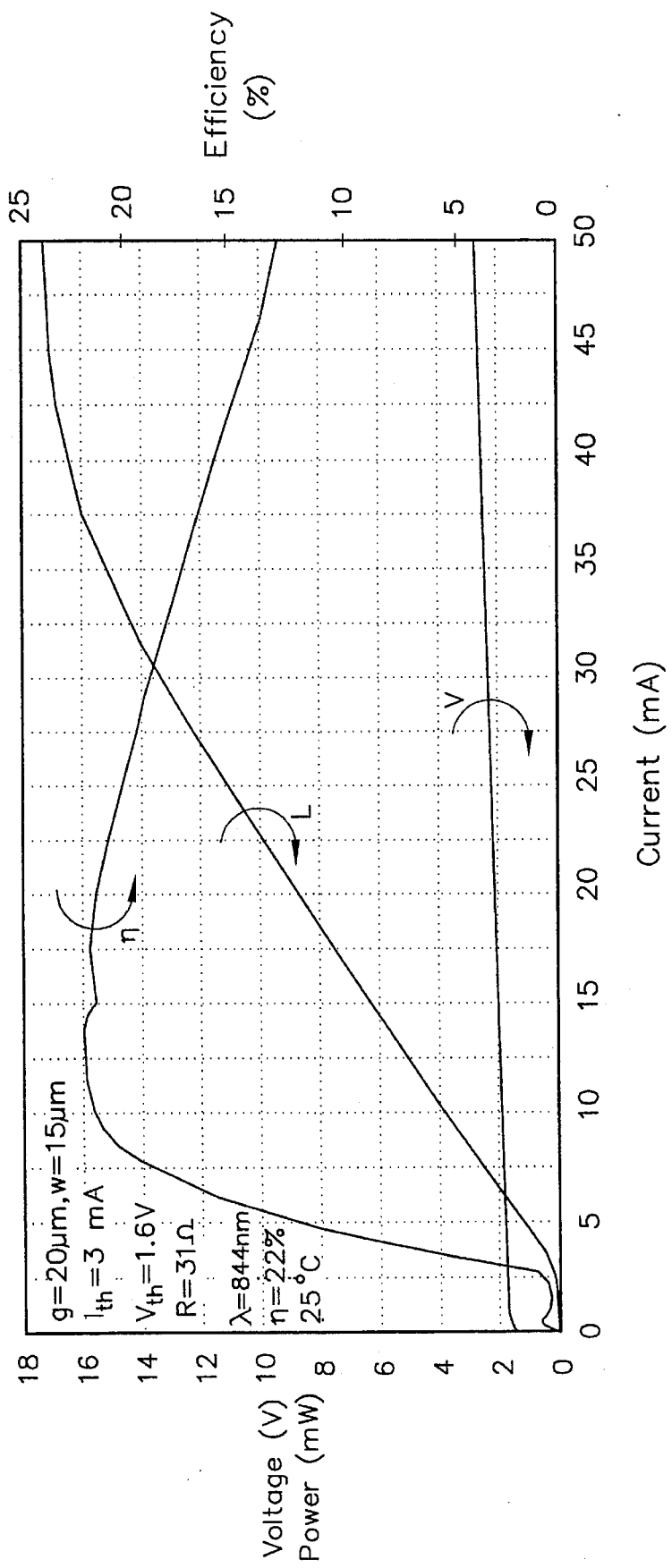
FIG. 9 is a graph of typical light power-current-voltage (L-I-V) characteristics of a state-of-the-art GaAs/AlGaAs VCSEL.
Figure 10:
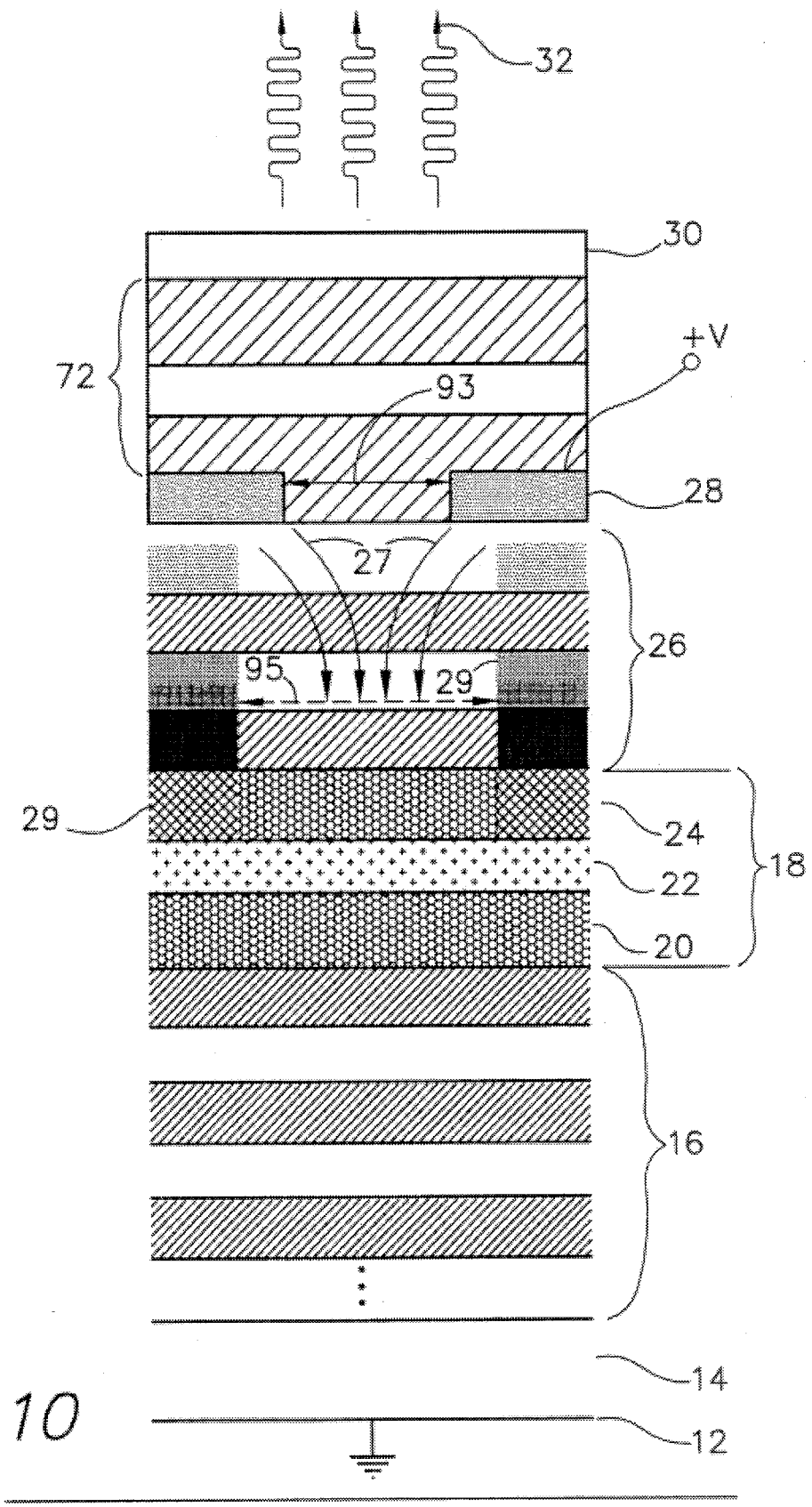
FIG. 10 shows a hybrid-DBR spatial-filtered VCSEL having a dielectric mirror, with spatial filtering for single $TEM_{00}$-mode control for improved performance and potential fabrication advantages.

The curves for device 60 of FIG. 3 are generated using InP/InGaAsP based materials near 1.55 microns. Typical light power-current-voltage (L-I-V) characteristics of state-of-the art GaAs/AlGaAs VCSELs are given in FIG. 9. FIG. 9 is a graph of power in milliwatts, voltage in volts and wallplug efficiency in percent versus current in milliamperes for a GaAs VCSEL having an implant diameter (g) of 20 microns, a window aperture (w) of 15 microns, a series resistance (R) of 31 ohms or less, and a wavelength (λ) of 844 nm at room temperature (25 degrees C.). Window aperture 93 and implant diameter 95 are illustrated in FIGS. 1 and 10. The graph of FIG. 9 reveals the VCSEL to have a 1.6 volt (0.1 volt above bandgap) CW threshold voltage, a 3 milliampere threshold current and a wallplug efficiency η of 22 percent. The power is proportional to the drive current. It is clear that an order of magnitude less drive current for a few milliamperes of power per element may be needed. This may also result in higher speed at lower drive-power requirements as compared to the VCSEL modeled in FIG. 3.

As noted above, the saturable absorber's size ($V_s$) and placement may be strategically designed parameters exploiting the optical field pattern of FIG. 8a affecting $\Gamma_s$, in order to control the oscillation frequency. $n_s$ and $g_s$ can also be affected by material, doping and wavelength of operation in an effort to engineer the VCSEL frequency response. To modulate the present VCSEL; the injection current ($I_a$) into the VCSEL can be varied; for a fixed VCSEL bias, using a third terminal (50 of FIG. 4), the carrier density, $n_s$, within the saturable absorber can be modified via additional or less current injection; or the saturable absorber can be reverse-biased, by simultaneously altering its absorption ($g_s$ and $n_s$) and carrier lifetime ($\tau_s$) and thus modulating the VCSEL self-oscillation frequency. In effect, the latter is the shifting of a given k-value curve of FIG. 3. Furthermore, a given modulation frequency can be controlled in the fabrication process by location of the saturable absorber ($\Gamma_s$) and effects of the mirror design and cavity Q (P, $\Gamma_s$). For example, Q can be altered by varying the epi-mirror or design, or by exploiting a hybrid semiconductor/dielectric mirror 72 as illustrated in FIG. 10. This approach may also have the additional advantage of controlling the laser to single transverse mode emission stability over the entire operating range. $\Gamma_s$ and Q may also be altered by changing laser size (and hence threshold current), all of which permit great design flexibility into a VCSEL GHz generator.

Figure 11:
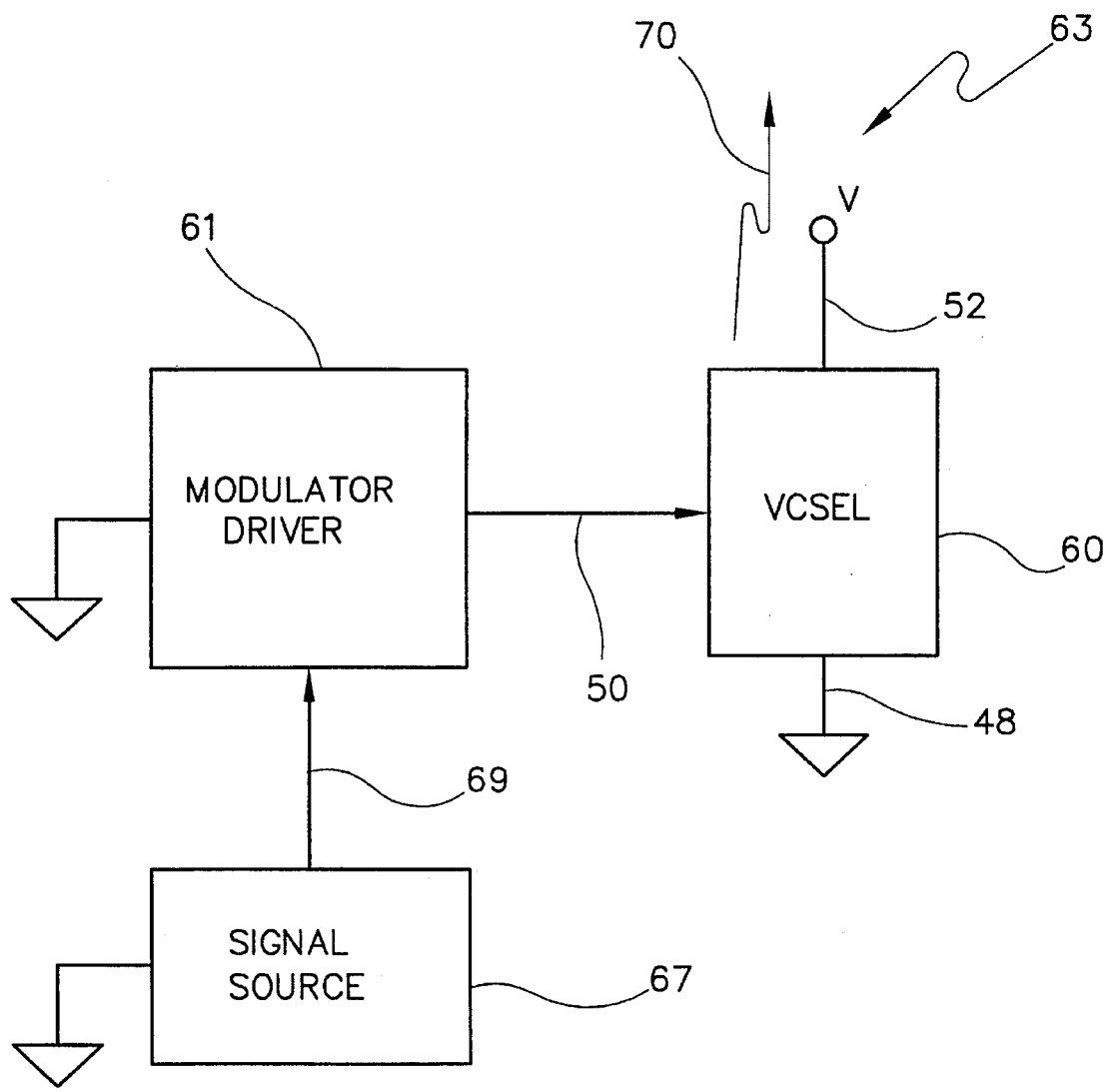
FIG. 11 is a diagram of a modulator and the three terminal VCSEL for providing frequency-modulated self-pulsations.

FIG. 11 shows a configuration 63 which incorporates VCSEL 60 of FIG. 4. Self-pulsing light 70 of VCSEL 60 is frequency modulated with amplitude signals across terminals 50 and 48 from modulator driver 61. Modulator driver 61 receives signals 69 that are to modulate the self-pulsating light 70 from signal source 67. Signals 69, having a digital and/or analog format, may originate as signals conveying data, control information, communications and so forth.

The laser cavity frequency itself has been estimated to be in the tens of the GHz regime (at about 50 GHz from the modulation response of the VCSEL shown in FIG. 10.). Naturally, individual VCSELs are inherently extendible to both one and two dimensional arrays permitting easy multiplexing of numerous GHz channels into a 100 plus GHz transmitter in a cost-effective, high yield style. Individual elements operating modulation frequency range can be controlled by fabrication and/or tuned in operation. The total operating range across the array can be increased by varying each element structure, and also subsequently tuned as discussed previously.

Figure 12:
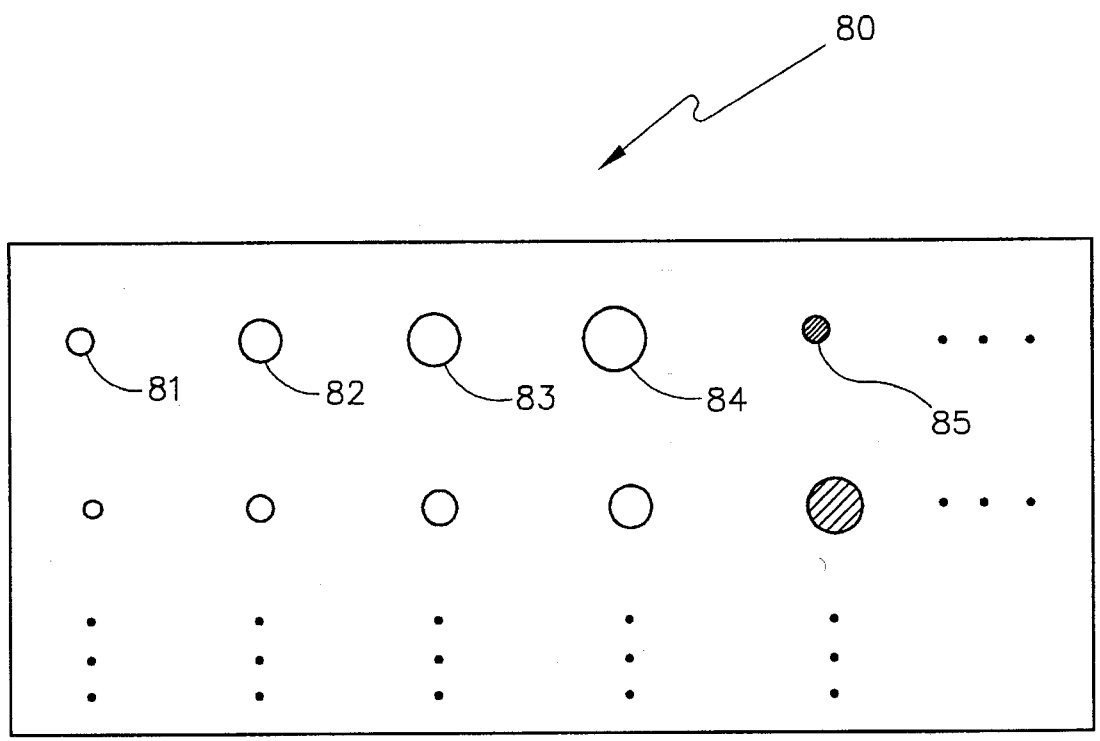
FIG. 12 reveals an array of VCSELs having various sized and/or structured VCSEL apertures.

FIG. 12 shows an array 80 of rows or columns of VCSELs having apertures of various sizes. For instance, VCSELs 81, 82, 83 and 84 may have aperture sizes of 10, 20, 30 and 40 microns, and self-pulsation frequencies of 100, 70, 50, and 30 GHz, respectively, for same drive current and electrical power applied to those VCSELs. VCSEL 85 has the same aperture size as that of VCSEL 81 but a self-pulsation frequency of 120 GHz which is higher than that of VCSEL 81 for the same applied drive current and electrical power. The only structural difference between VCSELs 81 and 85 is that VCSEL 85 has a dielectric mirror layer that increases the Q of its cavity thereby increasing its self-pulsation frequency. Increasing the drive current would increase the self-pulsation frequencies of all the VCSELs. Typically, array 80 would have two terminal VCSELs but could have three terminal VCSEL or a combination of them. The VCSELs of array 80 may be selectively turned on or off, or have their self-pulsation frequencies individually varied or modulated. Such an array would allow for a greatly extended bandwidth. On the other hand, FIG. 12 may represent an array wherein the phases of each of the VCSELs of array 80 may be controlled relative to one another via current or external delays to result in a VCSEL phased array.

Figure 13:
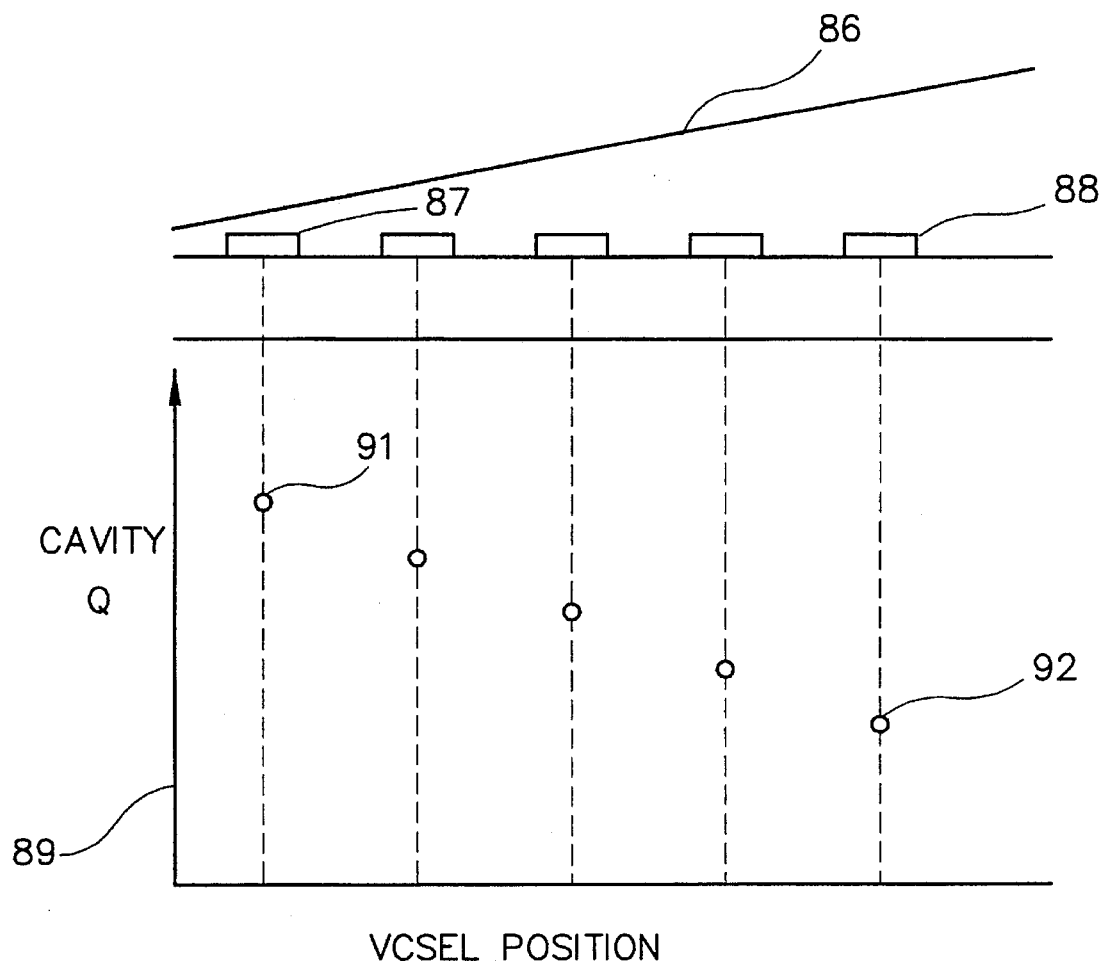
FIG. 13 is a cross section of an array of VCSELs having a Q-graded coating.

FIG. 13 reveals a cross section of an array of VCSELs having the same structural and electrical characteristics. However, a coating 86 of material having a varying thickness is applied to the VCSEL array. Coating 86 has the effect of altering the Q of the VCSEL relative to the thickness of the coating immediately or directly over the respective VCSEL. For example, the greater the thickness of coating 86, the lower the Q of the respective VCSEL as shown by Q's 91 and 92 plotted in graph 89 and positions 87 and 88 of the respective VCSELs.

A plurality of VCSELs may be formed into a phased array wherein the phase relationships among the VCSEL outputs are controlled and the outputs can be selectively switched to generate radiator groupings for establishing a particular or desired radiated pattern for a certain direction at a particular frequency.

Variations of the embodiment described are contemplated. For example, the controllable mirror may use any voltage for a controllable effect. The light may be emitted through either the substrate at one end or the top mirror at the other end. It will also be understood that the term, "vertical," is used to mean perpendicular to the major surfaces of the substrate. The means for injecting power can have first and second conductivity types on opposite sides of the active region, either along the axis formed by the first mirror, active region and second mirror, or along some other axis.

I claim:

1. A VCSEL system comprising:
   a plurality of VCSELs wherein-each VCSEL of said plurality, comprises:
   a first mirror region having a first terminal;
   a second mirror region having a second terminal;
   an active region situated between the first and second mirror regions; and
   a saturable absorber situated between the first and second terminals; and
   wherein for certain magnitudes of power applied to the first and second terminals, the VCSEL outputs self-pulsing light having certain frequencies corresponding to the certain magnitudes of power applied, respectively;
   a signal source for providing a signal having an amplitude; and
   a modulation driver, connected to the first and second terminals of each VCSEL and to said signal source, for providing the power applied having a magnitude varied in accordance with the amplitude of the signal from said signal source, to each VCSEL to affect the frequency of self-pulsing light of each VCSEL, the frequency of the self-pulsing light modulated in accordance with the signal from said signal source.

2. The VCSEL system of claim 1 wherein each VCSEL of said plurality of VCSELs has a third terminal situated between the first and second terminal, the third terminal for receiving a second signal to effect frequency modulation of the frequency of self-pulsing light.

3. The VCSEL system of claim 1 wherein each VCSEL of said plurality of VCSELs has a frequency of self-pulsation that is different from a frequency of self-pulsation of other VCSELs of said plurality of VCSELs, for a certain magnitude of power applied to the first and second terminals of each VCSEL of said plurality of VCSELs.

4. The VCSEL system of claim 1 wherein said plurality of VCSELs is arranged in an array.

5. The VCSEL system of claim 4 wherein said array is a phased array wherein the phase relationships among VCSEL outputs are controlled and the outputs can be selectively switched to generate radiator groupings for establishing a selected radiated pattern for a certain direction at a particular frequency.

6. The VCSEL system of claim 1 wherein each VCSEL is a local oscillator.

7. The VCSEL system of claim 1 wherein at least one VCSEL has a noncoherent output.

8. The VCSEL system of claim 7 wherein the at least one VCSEL is for communications.

9. The VCSEL system of claim 8 wherein the at least one VCSEL is for reducing modal noise or speckle.

10. A VCSEL, for outputting a self-pulsing light having a frequency, comprising:
- a first mirror region having a first terminal;
- a second mirror region having a second terminal;
- an active region situated between the first and second mirror regions; and
- a saturable absorber, situated between the first and second terminals, having a third terminal; and
- a power source connected to the first and second terminals of said VCSEL;
- a signal source for providing a signal having an amplitude; and
- a modulation driver, connected to the first and third terminals of said VCSEL and to said signal source, for providing power having a magnitude varied in accordance with the amplitude of the signal from said signal source, to said VCSEL to affect the frequency of the self-pulsing light of said VCSEL, the frequency of the self-pulsing light modulated in accordance with the signal from said signal source.

11. A frequency modulated self-pulsing VCSEL comprising:
- a VCSEL comprising:
  - a first mirror region having a first terminal;
  - a second mirror region having a second terminal;
  - an active region situated between the first and second mirror regions; and
  - a saturable absorber situated between the first and second terminals;
- a power source, connected to the first and second terminals of said VCSEL, for providing variable power to said VCSEL to affect a pulsing of a light output of said VCSEL, the pulsing having a frequency modulated by the variable power from said power source; and
- a third terminal connected to said VCSEL and situated between the first and second terminal, the third terminal for receiving a signal to effect frequency modulation of the frequency of the pulsing.

12. A frequency modulated self-pulsing VCSEL comprising:
- a VCSEL having a saturable absorber, and first and second terminals; and
- a variable power source, connected to the first and second terminals of said VCSEL, for providing a variable injected power through the VCSEL which results in a variable frequency of pulsing of a light output of said VCSEL, in proportion to the variable injected power; and
- a third terminal for receiving a signal having a variable amplitude to effect frequency modulation of the frequency of the pulsing.

* * * * *